United States Patent
Jou et al.

(10) Patent No.: US 9,825,090 B2
(45) Date of Patent: *Nov. 21, 2017

(54) LIGHT-EMITTING STRUCTURE

(71) Applicant: EPISTAR CORPORATION, Hsinchu (TW)

(72) Inventors: Li-Ping Jou, Kaohsiung (TW); Yu-Chen Yang, Tainan (TW); Jui-Hung Yeh, Zhongli (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/401,850

(22) Filed: Jan. 9, 2017

(65) Prior Publication Data

US 2017/0117321 A1  Apr. 27, 2017

Related U.S. Application Data

(60) Continuation of application No. 14/954,708, filed on Nov. 30, 2015, which is a division of application No. 14/330,914, filed on Jul. 14, 2014, now Pat. No. 9,202,981, which is a division of application No. 14/065,330, filed on Oct. 28, 2013, now Pat. No. 8,779,449, which is a division of application No.
(Continued)

(30) Foreign Application Priority Data

Mar. 23, 2011  (TW) .............................. 100110029 A

(51) Int. Cl.
*H01L 33/00* (2010.01)
*H01L 27/15* (2006.01)
*H01L 33/62* (2010.01)
*H01L 33/38* (2010.01)

(52) U.S. Cl.
CPC .......... *H01L 27/156* (2013.01); *H01L 33/382* (2013.01); *H01L 33/62* (2013.01); *H01L 2933/0016* (2013.01)

(58) Field of Classification Search
CPC ..... H01L 27/156; H01L 33/62; H01L 33/382; H01L 2933/0016
See application file for complete search history.

(56) References Cited

U.S. PATENT DOCUMENTS 9,553,127 B2 * 1/2017 Jou ....................... H01L 27/156
2002/0005523 A1  1/2002 Taniguchi et al.
(Continued)

FOREIGN PATENT DOCUMENTS

WO  2009106063 A1  9/2009

*Primary Examiner* — Dung Le
(74) *Attorney, Agent, or Firm* — Ditthavong & Steiner, P.C.

(57) ABSTRACT

A light-emitting structure includes a first epitaxial unit; a second epitaxial unit disposed next to the first epitaxial unit; a crossover metal layer including a first protruding portion laterally overlapping the first epitaxial unit and the second epitaxial unit wherein the first protruding portion is electrically connected with the first epitaxial unit and the second epitaxial unit; a conductive connecting layer disposed below the first epitaxial unit and the second epitaxial unit and surrounding the first protruding portion; and an electrode arranged on the conductive connecting layer.

20 Claims, 18 Drawing Sheets

Related U.S. Application Data

13/428,974, filed on Mar. 23, 2012, now Pat. No. 8,569,775.

(56) References Cited

U.S. PATENT DOCUMENTS

| | | |
|---|---|---|
| 2011/0233587 A1 | 9/2011 | Unno |
| 2012/0007044 A1 | 1/2012 | Seo et al. |

\* cited by examiner

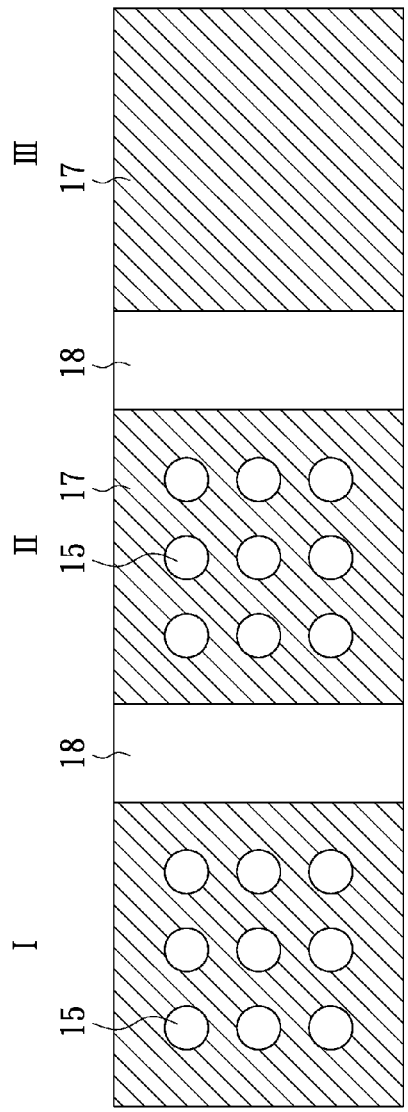
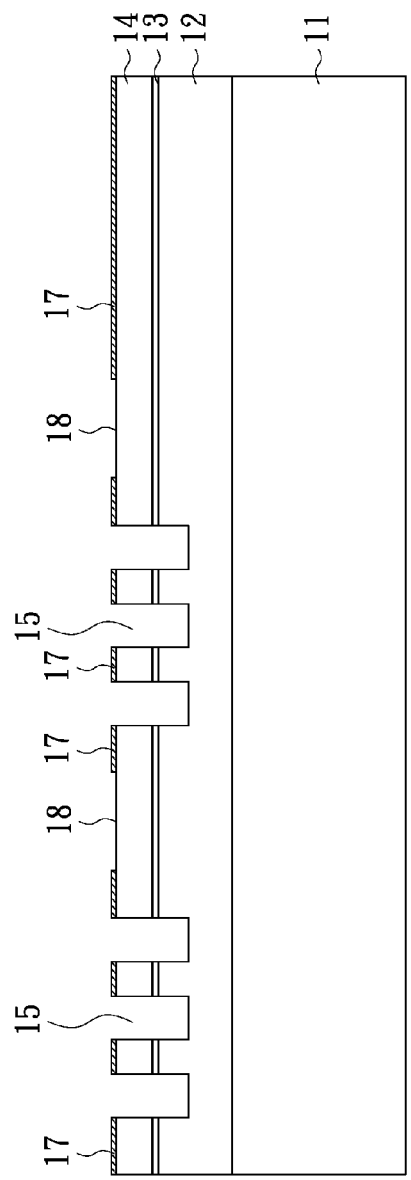
FIG. 1C'
FIG. 1C

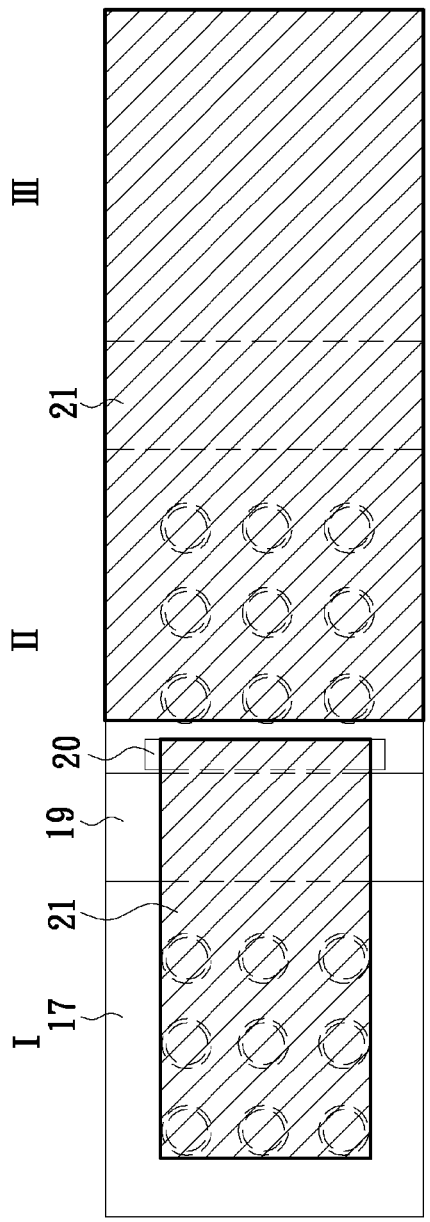
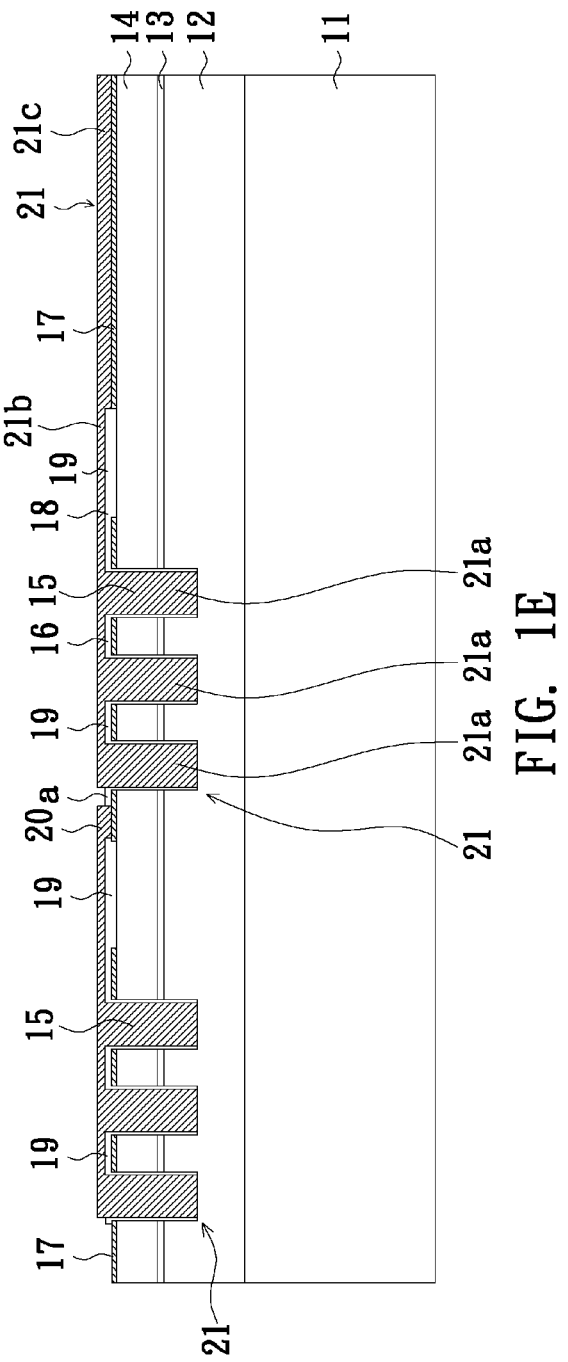
FIG. 1E'
FIG. 1E

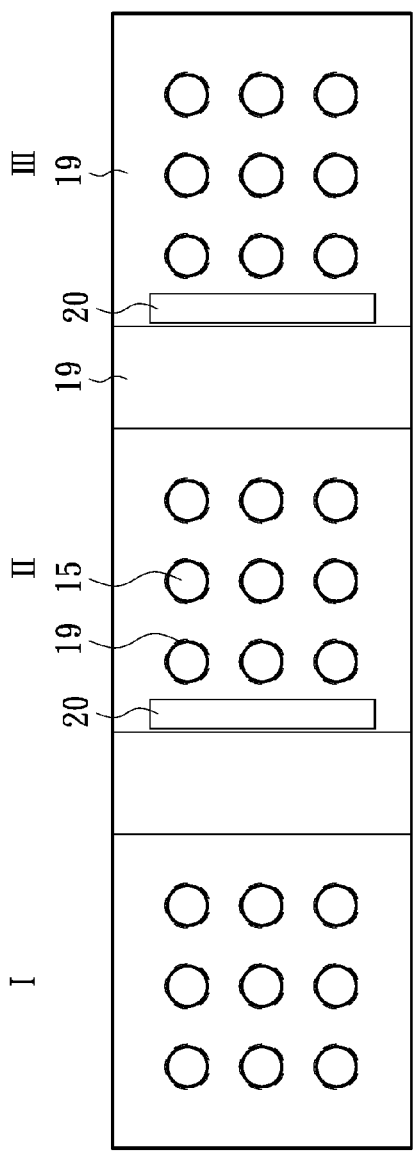
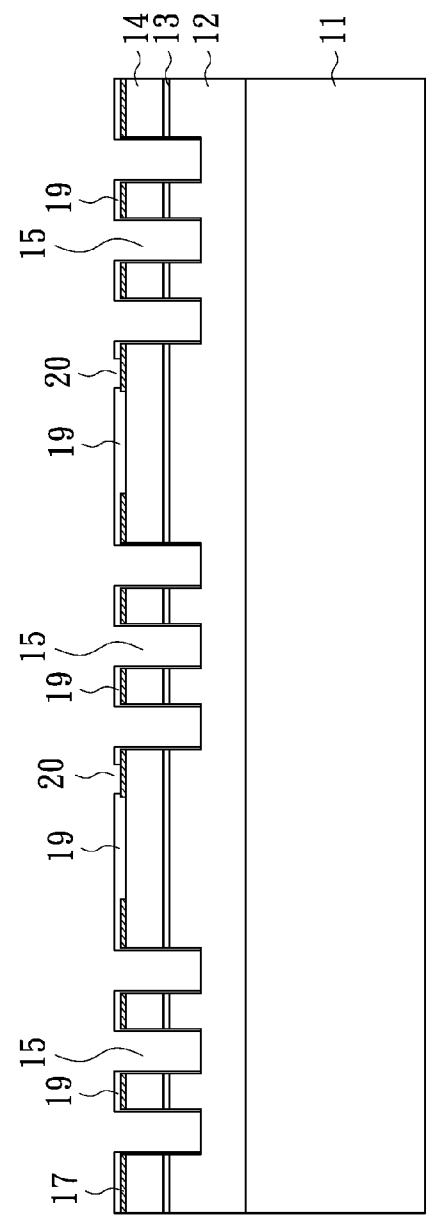
FIG. 2D'
FIG. 2D

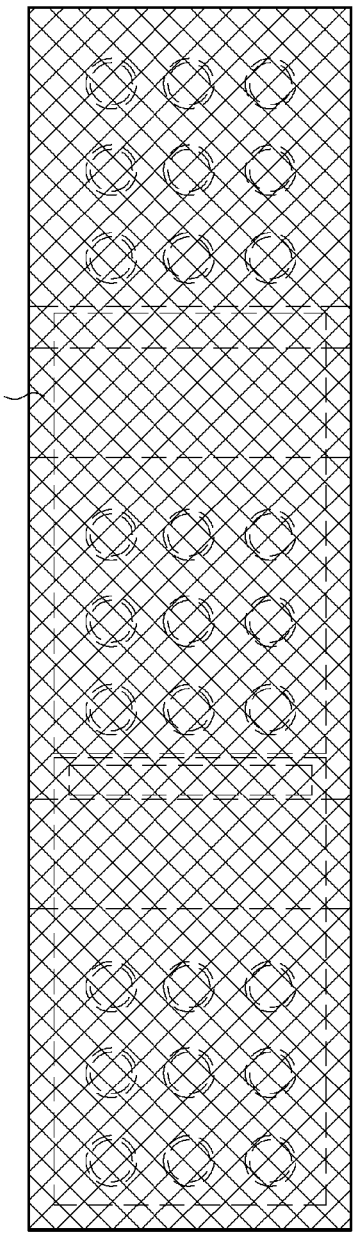
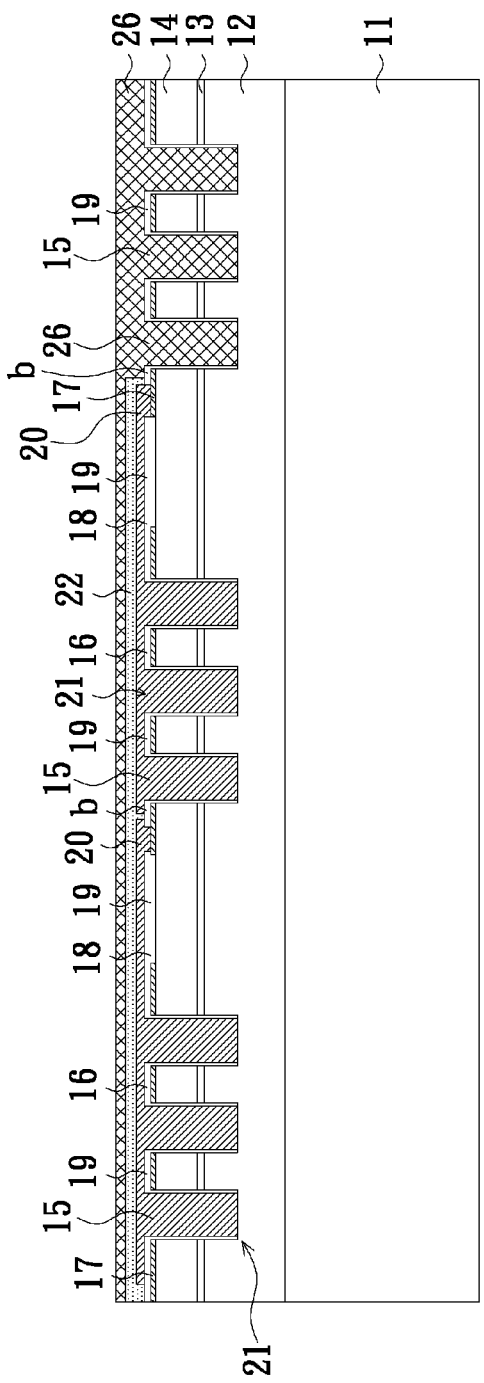
FIG. 2G'
FIG. 2G

LIGHT-EMITTING STRUCTURE

REFERENCE TO RELATED APPLICATION

This application is a continuation Application of U.S. Ser. No. 14/954,708 entitled "LED ARRAY", filed on Nov. 30, 2015 which is a divisional Application of U.S. Ser. No. 14/330,914, entitled "LED ARRAY", filed on Jul. 14, 2014, now pending, which is a division of U.S. patent application, Ser. No. 14/065,330, entitled "LED ARRAY", filed on Oct. 28, 2013, issued on Jul. 15, 2014, which is a division of U.S. patent application, Ser. No. 13/428,974, entitled "LED ARRAY", filed on Mar. 23, 2012, issued on Oct. 29, 2013, which claims the right of priority based on Taiwan patent application Ser. No. 100110029, filed on Mar. 23, 2011, the entireties of which are incorporated by reference herein.

TECHNICAL FIELD

The application relates to a light-emitting structure, and more particularly to a light-emitting structure having protrusion portion.

DESCRIPTION OF BACKGROUND ART

Recently, based on the progress of epitaxy process technology, the light-emitting diode (LED) becomes one of the potential solid-state lighting (SSL) source. Due to the limitation of physics mechanism, LEDs can only be driven by DC power source. Thus the regulator circuit, buck circuit, and other electronic devices are necessary for every lighting device using LED as lighting source to convert AC power source into DC power source to drive LED. However, the addition of the regulator circuit, buck circuit, and other electronic device raises the cost of lighting device using LED as lighting source and causes the low AC/DC conversion efficiency and the huge lighting device package also affect the reliability and shorten the lifetime of LED in daily use.

SUMMARY OF THE DISCLOSURE

The present application discloses a light-emitting structure including a first epitaxial unit; a second epitaxial unit disposed next to the first epitaxial unit; a crossover metal layer including a first protruding portion laterally overlapping the first epitaxial unit and the second epitaxial unit wherein the first protruding portion is electrically connected with the first epitaxial unit and the second epitaxial unit; a conductive connecting layer disposed below the first epitaxial unit and the second epitaxial unit and surrounding the first protruding portion; and an electrode arranged on the conductive connecting layer.

The present application discloses a light-emitting structure including a light-emitting unit; a crossover metal layer comprising a protruding portion laterally overlapping the light-emitting unit, wherein the protruding portion is electrically connected with the light-emitting unit; a conductive connecting layer disposed below the light-emitting and surrounding the protruding portion; and an electrode arranged on the conductive connecting layer; wherein a top surface of the protruding portion contacts a surface of the light-emitting unit or the protruding portion is devoid of passing through the first epitaxial unit.

The present application discloses an LED array comprising a permanent substrate, a bonding layer on the permanent substrate, a second conductive layer on the bonding layer, a second isolation layer on the second conductive layer, a crossover metal layer on the second isolation layer, a first isolation layer on the crossover metal layer, a conductive connecting layer on the first isolation layer, an epitaxial structure on the conductive connecting layer, and a first electrode layer on the epitaxial structure.

The present application further discloses an LED array comprising a permanent substrate, a bonding layer on the permanent substrate, a first conductive layer on the bonding layer, a second isolation layer on the first conductive layer, a crossover metal layer on the second isolation layer, a first isolation layer on the crossover metal layer, a conductive connecting layer on the first isolation layer, and an epitaxial structure on the conductive connecting layer.

The present application further discloses an Led array having N light-emitting diode units (N≥3) and the light-emitting diode units are electrically connected with each other by the crossover metal layer.

BRIEF DESCRIPTION OF THE DRAWINGS

FIGS. 1A-1I are the cross sectional views of the LED array in accordance of the first embodiment of present application.

FIGS. 1A'-1G' are the top views of the first embodiment of LED array disclosed by present application.

FIGS. 2A-2I are the cross sectional views of the second embodiment of LED array disclosed by present application.

FIGS. 2A'-2G' are the top views of the second embodiment of LED array disclosed by present application.

DETAILED DESCRIPTION OF PREFERRED EMBODIMENTS

The present application discloses an LED array having N light-emitting diode units (N≥3) comprising a first light-emitting diode unit, a second light-emitting diode unit in sequence to the $(N-1)^{th}$ light-emitting diode unit and an $N^{th}$ light-emitting diode unit. The LED array further comprises a first area (I), the second area (II), and the third area (III). The first area (I) comprises the first light-emitting diode unit, the third area (III) comprises the $N^{th}$ light-emitting diode unit, and the second area (II) locates between the first area (I) and the third area (III) and comprises the second light-emitting diode unit in sequence to the $(N-1)^{th}$ diode units.

Figure 1A:
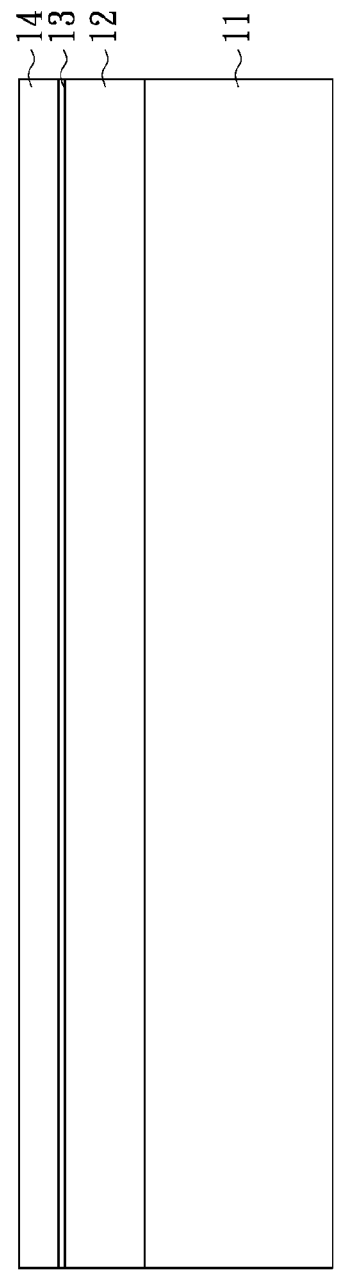
Figure 1A:
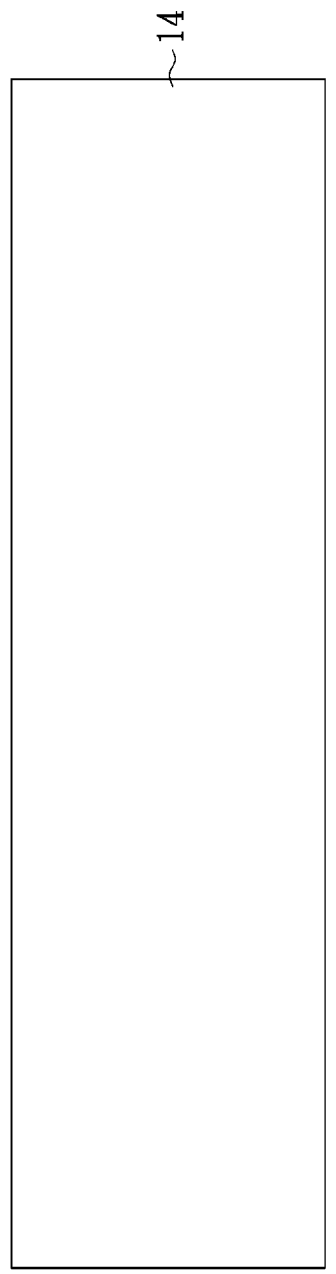
Figure 1B:
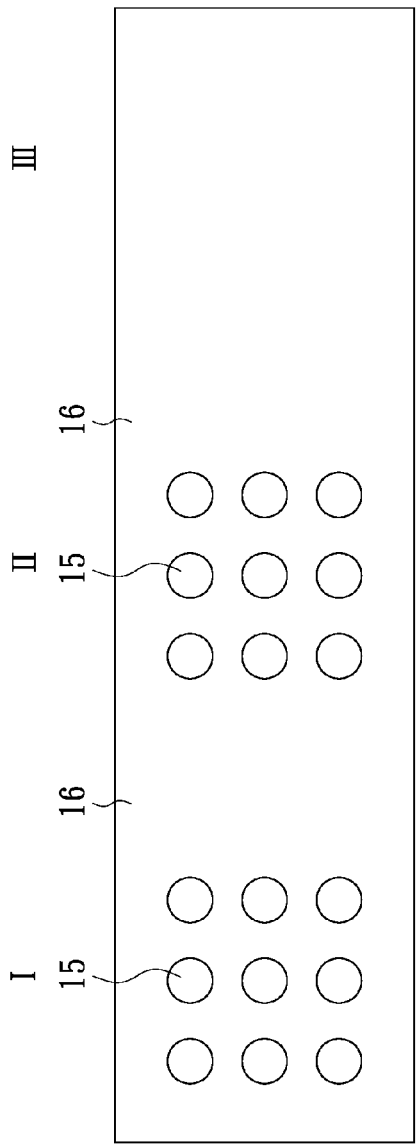
Figure 1B:
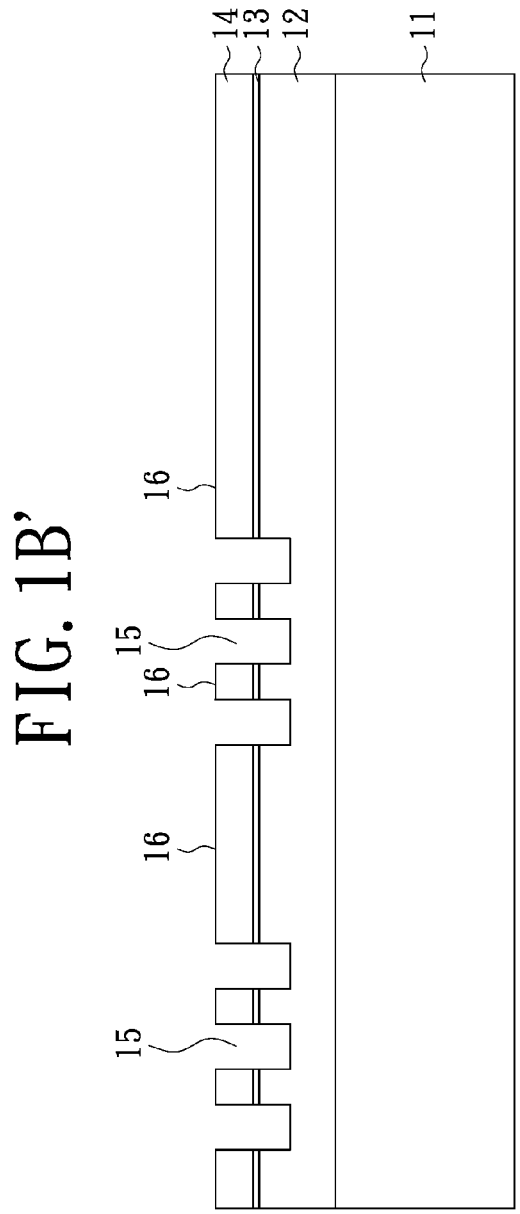

The first embodiment discloses a first LED array 1 having three light-emitting diode units. FIGS. 1A to 1I illustrate the cross sectional views and the FIGS. 1A' to 1G' illustrate the top views of the first embodiment of the first LED array 1. The method for manufacturing the first LED array 1 comprises steps of:

1. Providing a temporary substrate 11, and forming an epitaxial structure thereon. The epitaxial structure comprises a first conductive semiconductor layer 12, an active layer 13, and a second conductive semiconductor layer 14 as illustrated in FIGS. 1A and 1A'.
2. Next, forming multiple trenches 15 by partially etching the epitaxial structure in the first area (I) and the second area (II), and the epitaxial structure not etched forms multiple flat planes 16, and the epitaxial structure of the third area (III) is not etched as illustrated in FIGS. 1B and 1B'.
3. Forming a conductive connecting layer 17 on partial regions of the flat planes 16, and the area of the flat planes 16 uncovered by the conductive connecting layer 17 forms multiple pathways 18 as illustrated in FIGS. 1C and 1C'.

Figure 1D:
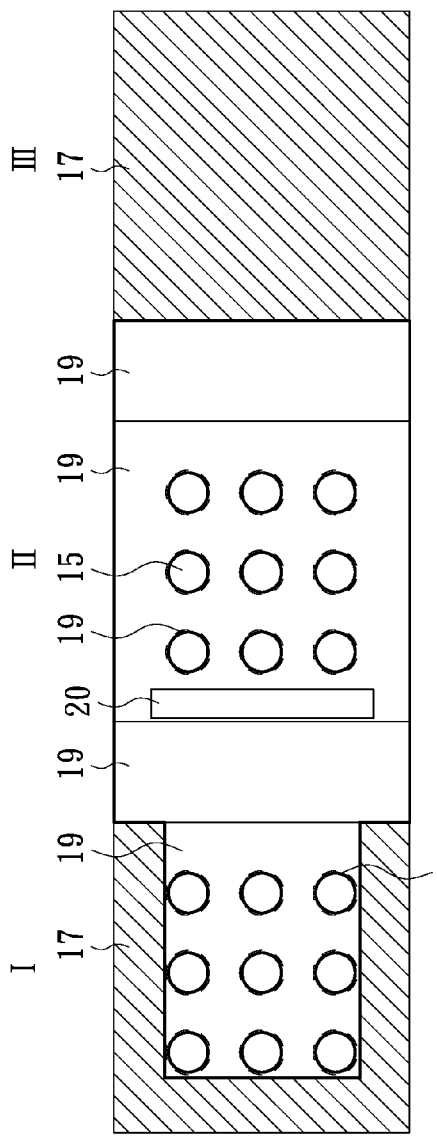
Figure 1D:
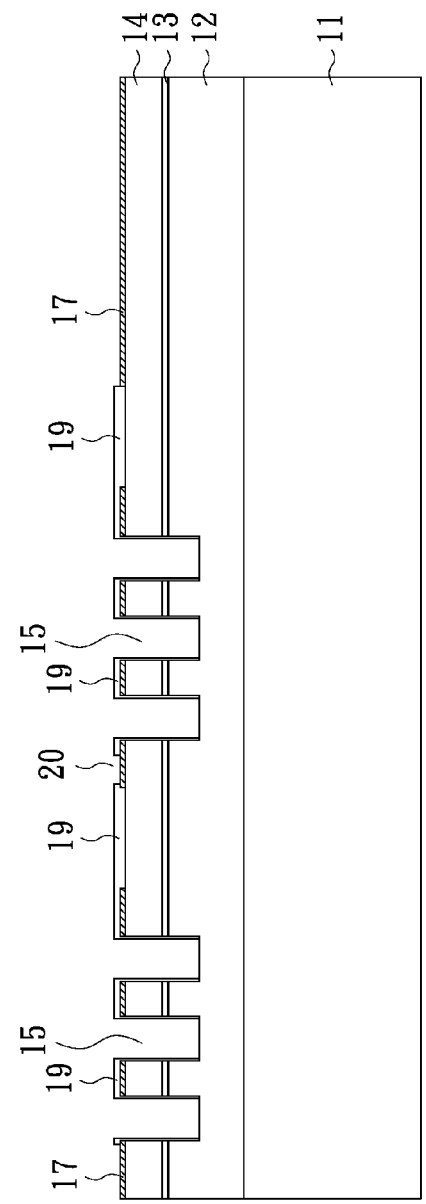
Figure 1F:
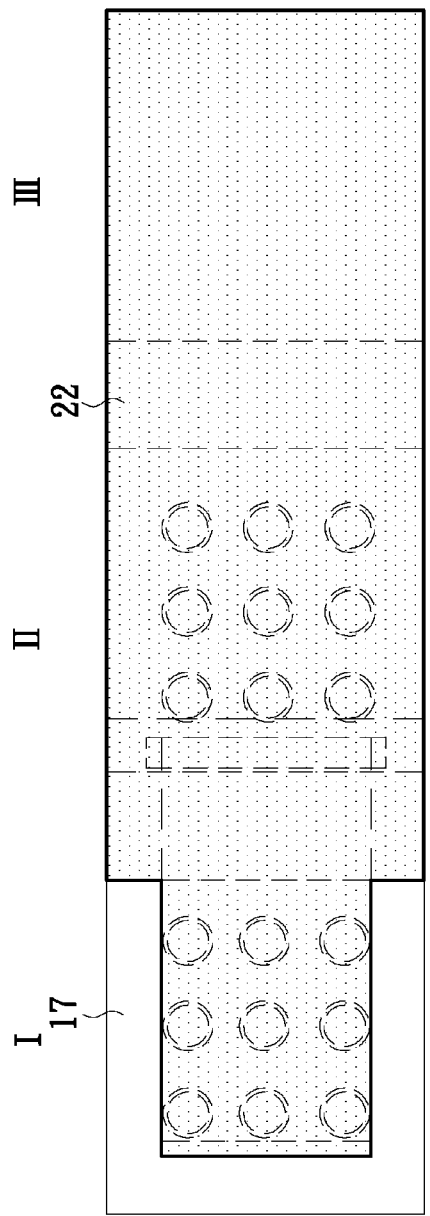
Figure 1F:
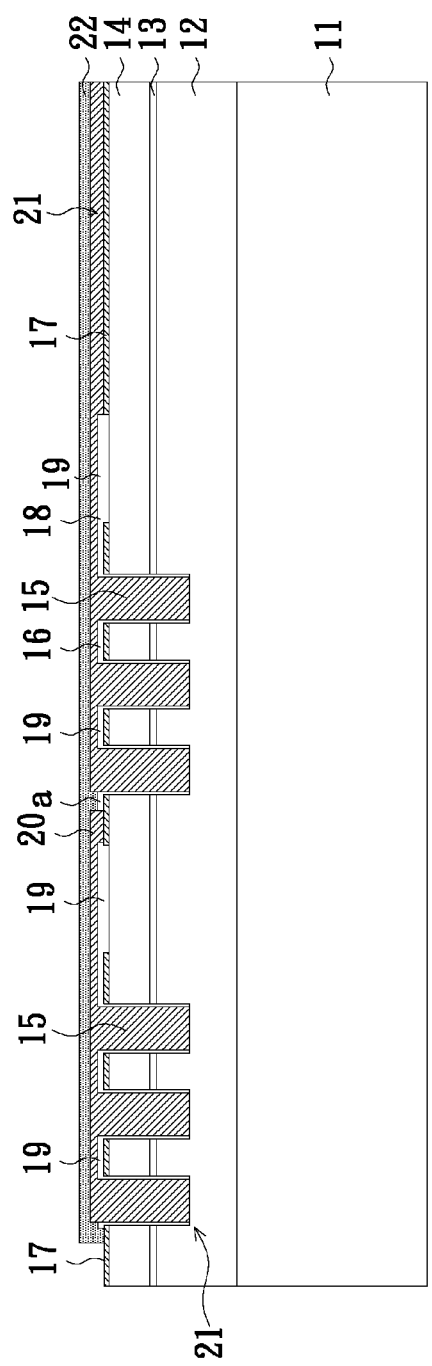
Figure 1G:
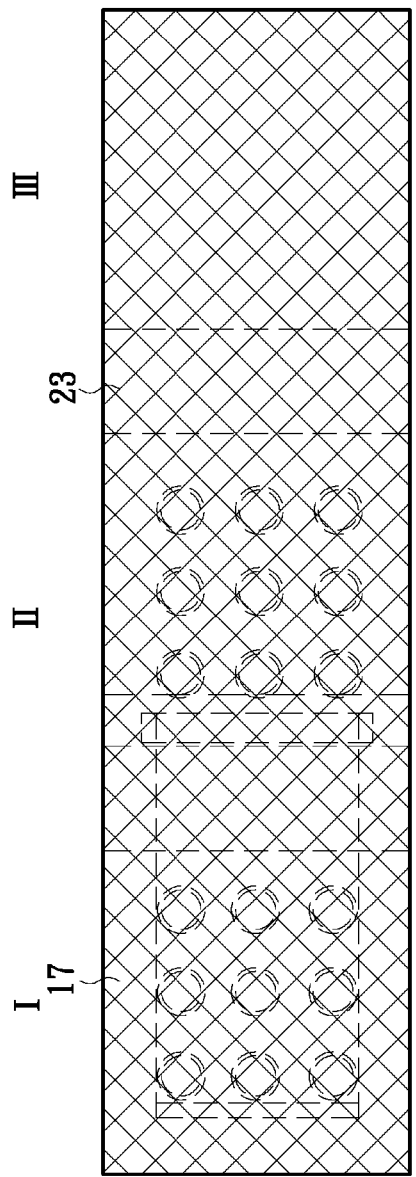
Figure 1G:
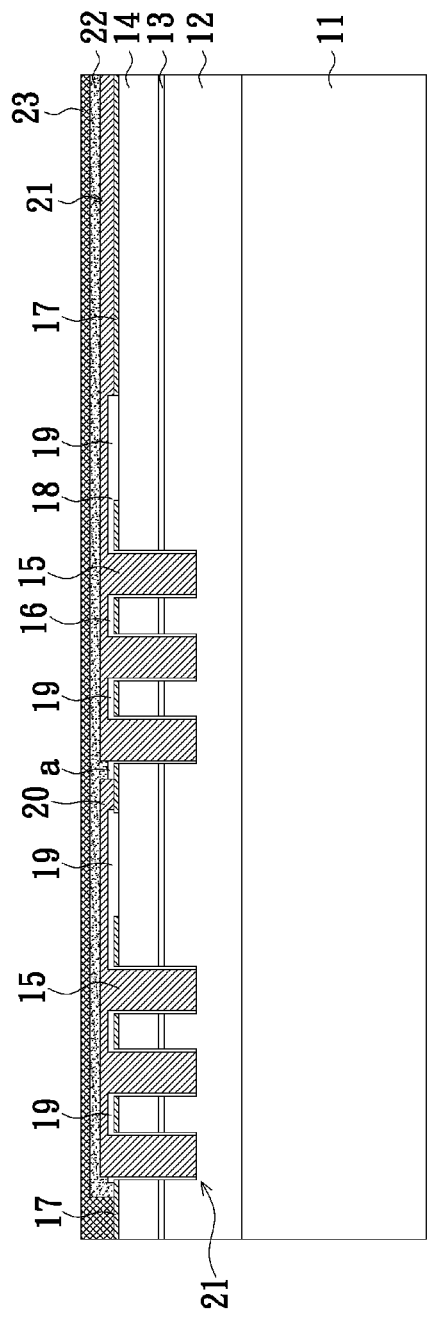
Figure 1H:
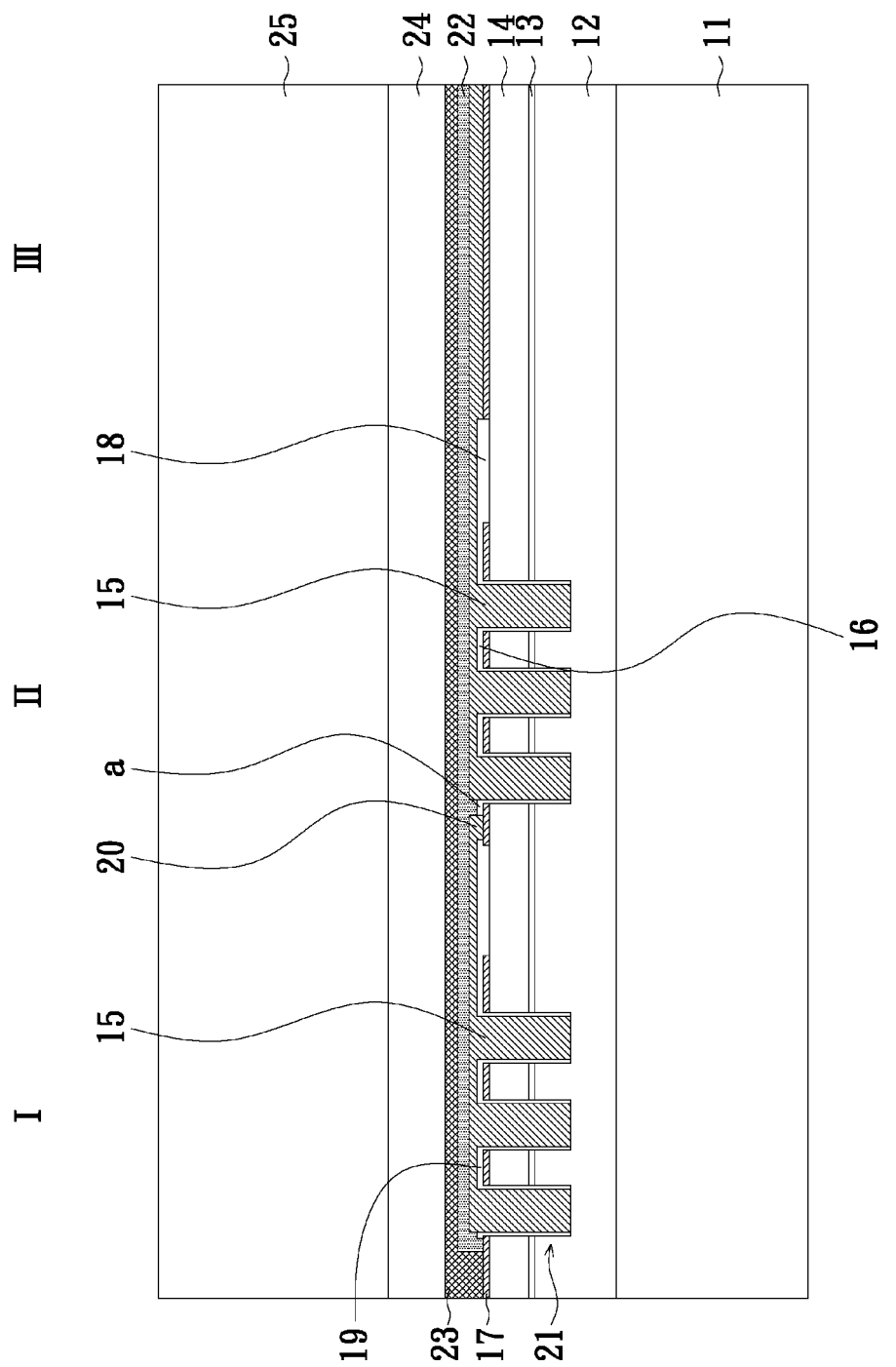

4. Forming a first isolation layer 19 on part of the conductive connecting layer 17, the multiple pathways 18, and the side wall of the multiple trenches 15, while the conductive connecting layer 17 in the third area (III) and part of the conductive connecting layer 17 in the first area (I) are not covered by the first isolation layer 19. The conductive connecting layer 17 not covered by the first isolation layer 19 in the second area (II) is defined as a conductive region 20 as illustrated in FIGS. 1D and 1D'.

5. Forming a crossover metal layer 21 on the first isolation layer 19, the conductive region 20, in multiple trenches 15, and on the conductive connecting layer 17 in the third area (III). A part of the conductive connecting layer 17 in the first area (I) is not covered by the crossover metal layer 21 in order to electrically connect the second conductive layer 23 with the second conductive semiconductor layer 14 in the following steps. The region which is not covered by the crossover metal layer 21 in the second area (II) nearby the conductive region 20 is used for electrical isolation as illustrated in the FIGS. 1E and 1E'. Part of the crossover metal layer 21 in the first area (I) extends to multiple trenches 15 and electrically connects to the first conductive semiconductor layer 12. The crossover metal layer 21 on multiple flat planes 16 and the pathways 18 in the first area (I) is electrically isolated from the second conductive semiconductor layer 14 by the first isolation layer 19. The crossover metal layer 21 on the conductive region 20 in the second area (II) electrically connects with the second conductive semiconductor layer 14 by the conductive connecting layer 17. Part of the crossover metal layer 21 in the second area (II) extends to multiple trenches 15 and electrically connects to the first conductive semiconductor layer 12. The crossover metal layer 21 on multiple flat planes 16 and the pathways 18 in the second area (II) is electrically isolated from the second conductive semiconductor layer 14 by the first isolation layer 19. The crossover metal layer 21 in the third area (III) is electrically connected with the second conductive semiconductor layer 14 by the conductive connecting layer 17.

6. Forming a second isolation layer 22 on the crossover metal layer 21 and the region a in the second area (II). But part of the conductive connecting layer 17 in the first area (I) is not covered by the second isolation layer 22 as illustrated in the FIGS. 1F and 1F'.

7. Forming the second conductive layer 23 on the second isolation layer 22 and part of the conductive connecting layer 17 as illustrated in the as illustrated in the FIGS. 1G and 1G'.

8. Forming a bonding layer 24 on the second conductive layer 23 which is bonded with a permanent substrate 25 by the bonding layer 24 as illustrated in the FIG. 1H.

Figure 1I:
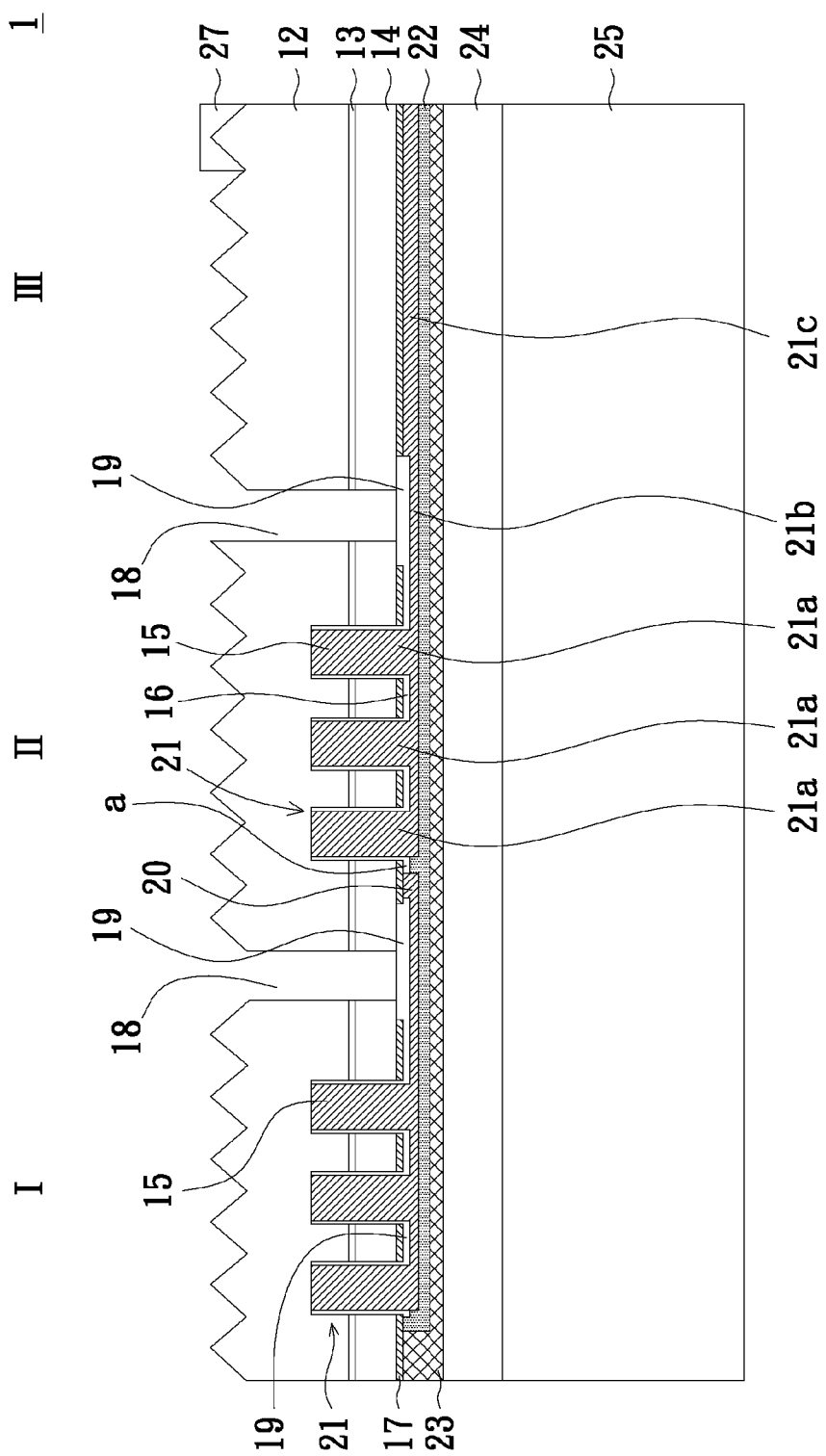

9. Removing the temporary substrate 11 to expose the first conductive semiconductor layer 12 and roughening the surface of the first conductive semiconductor layer 12. Next, etching multiple pathways 18 from the first conductive semiconductor layer 12 until the first isolation layer 19 is revealed in order to form N light-emitting diode units. Among the N light-emitting diode units, the first light-emitting diode unit locates in the first area (I), the second to the $(N-1)^{th}$ light-emitting diode units locate in the second area (II), and the $N^{th}$ light-emitting diode unit locates in the third area (III). At last, forming a first electrode layer 27 on the roughed surface of the first conductive semiconductor layer 12 in the $N^{th}$ light-emitting diode unit. Thus an LED array 1 having N light-emitting diode units electrically connected in serial by the crossover metal layer 21 is formed as illustrated in FIG. 1I.

Figure 2A:
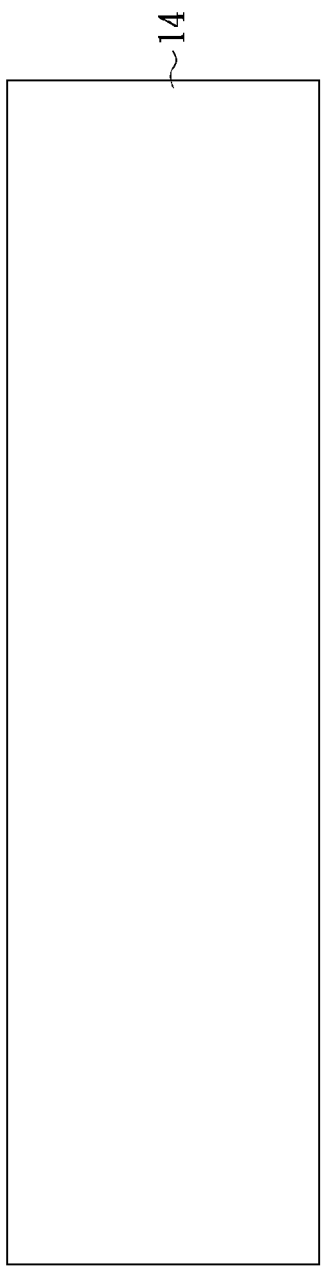
Figure 2A:
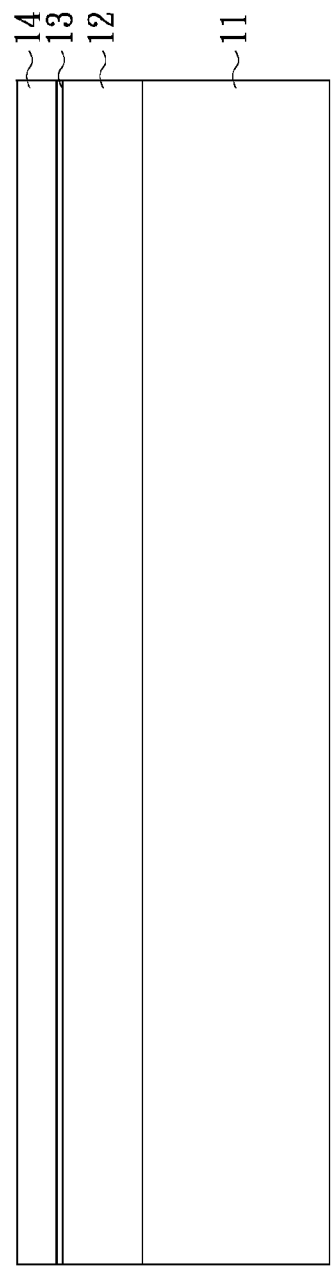

The second embodiment discloses a second LED array 2 having three light-emitting diode units. FIGS. 2A to 2I illustrate the cross sectional views and the FIGS. 2A' to 2G' illustrate the top views of the second embodiment of LED array 2. The method for manufacturing the second LED array 2 comprises steps of:

1. Providing a temporary substrate 11, and forming an epitaxial structure thereon. The epitaxial structure comprises a first conductive semiconductor layer 12, an active layer 13, and a second conductive semiconductor layer 14 as illustrated in FIGS. 2A and 2A'.

Figure 2B:
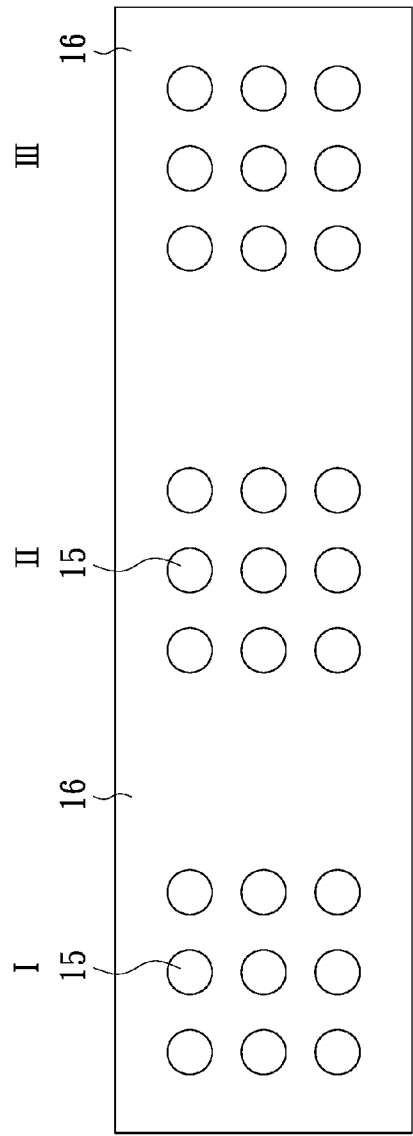
Figure 2B:
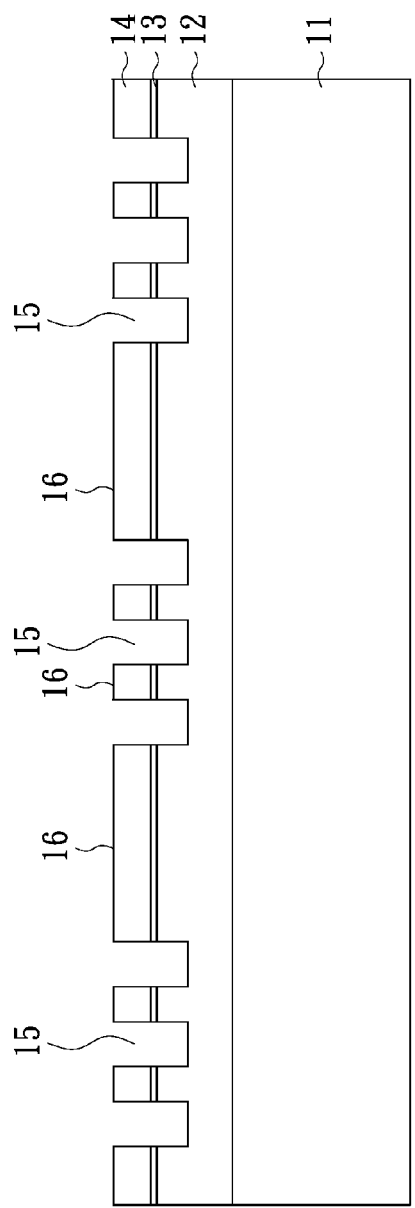

2. Next, forming multiple trenches 15 by partially etching the epitaxial structure in the first area (I), the second area (II), and the third area (III), and the epitaxial structure not etched forms multiple flat planes 16 as illustrated in FIGS. 2B and 2B'.

Figure 2C:
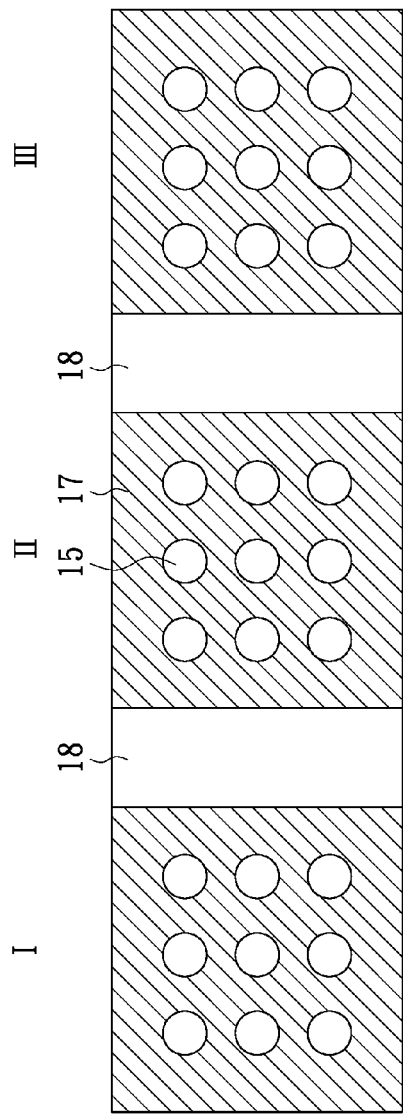
Figure 2C:
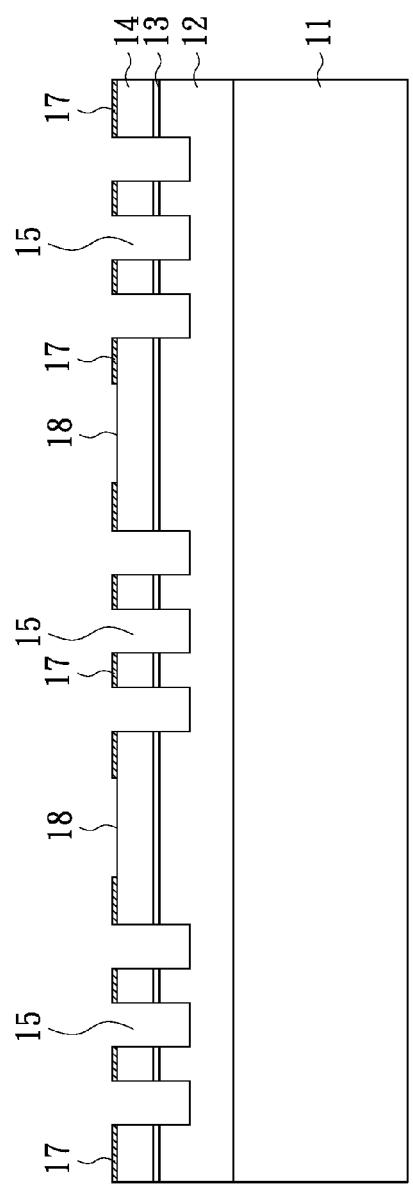
Figure 2E:
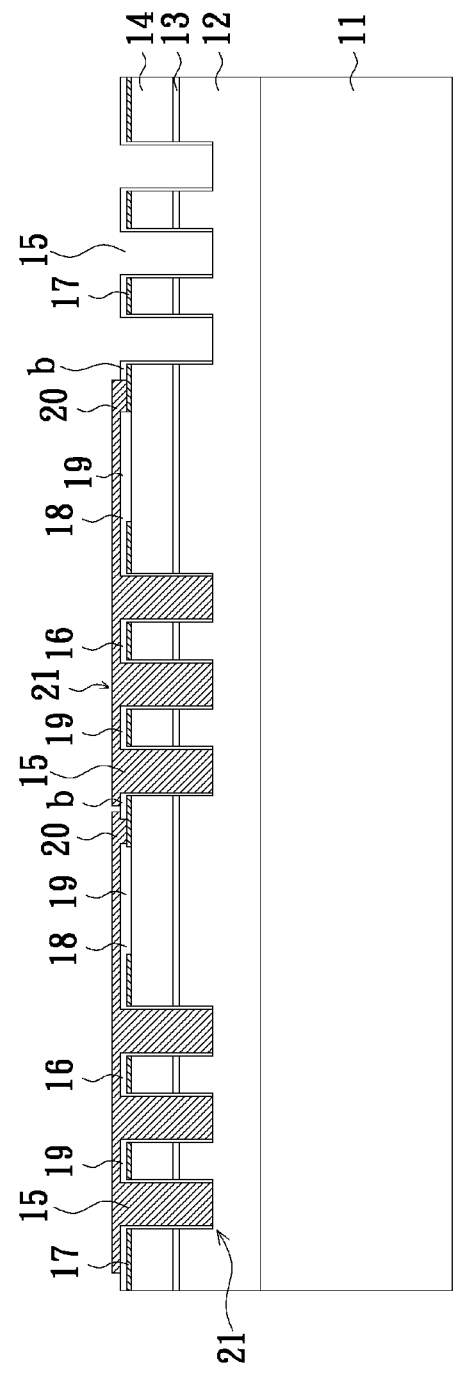
Figure 2E:
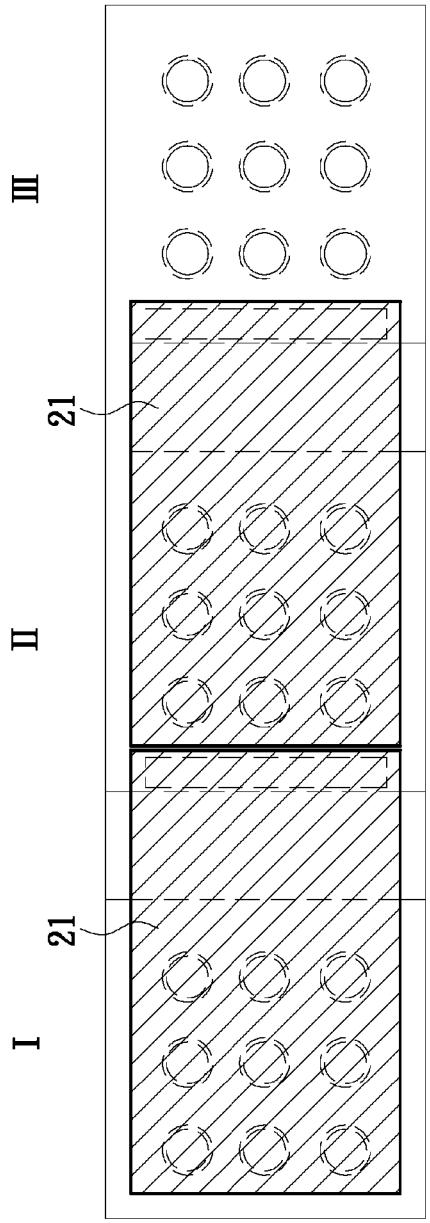
Figure 2F:
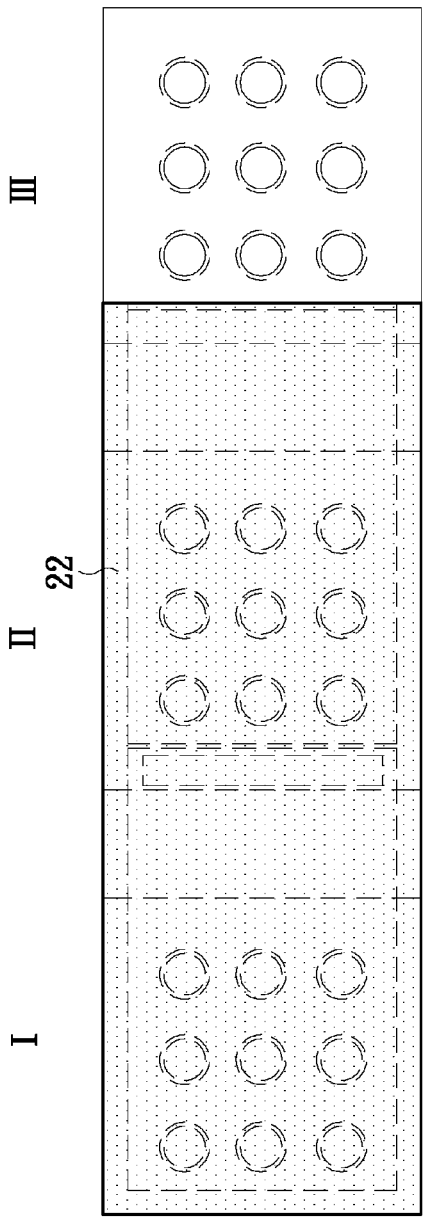
Figure 2F:
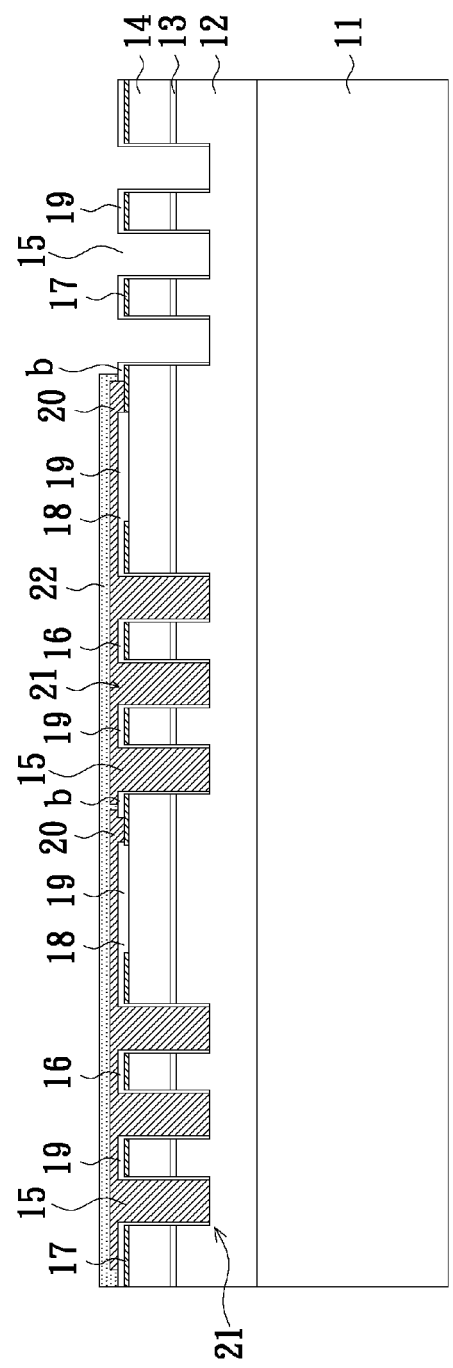
Figure 2H:
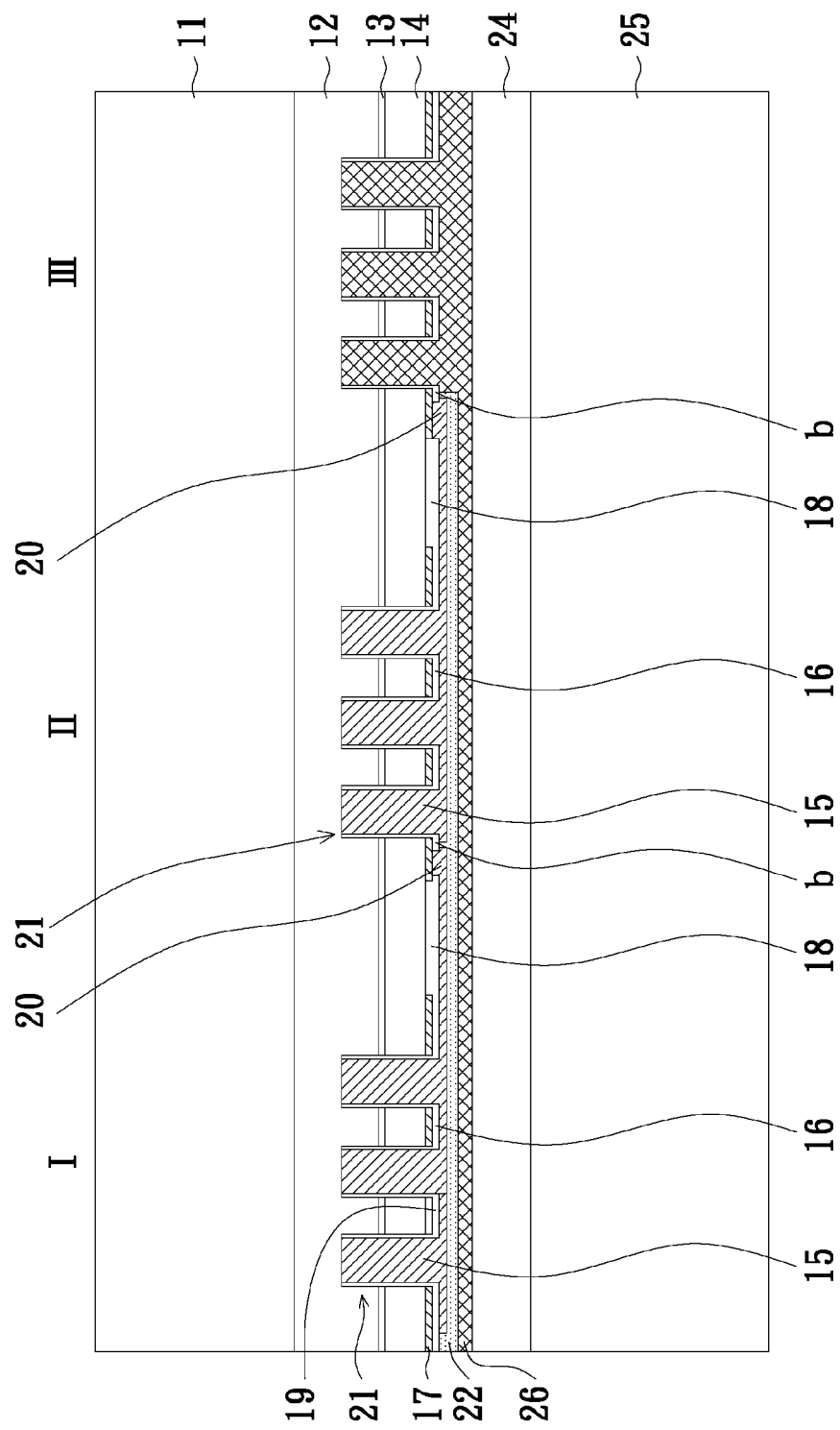

3. Forming a conductive connecting layer 17 on partial regions of the flat planes 16, and the area of the flat planes 16 uncovered by the conductive connecting layer 17 forms multiple pathways 18 as illustrated in FIGS. 2C and 2C'.

4. Forming a first isolation layer 19 on part of the conductive connecting layer 17, the multiple pathways 18, and the side wall of the multiple trenches 15. The conductive connecting layer 17 in the second area (II) and the third area (III) which is not covered by the first isolation layer 19 are defined as a conductive region 20 as illustrated in FIGS. 2D and 2D'.

5. Forming a crossover metal layer 21 on the first isolation layer 19, the conductive region 20, and in the multiple trenches 15 except those in the third area (III). A part of the first isolation layer 19 in the first area (I) is not covered by the crossover metal layer 21 in order to electrically isolate the first conductive layer 26 from the second conductive semiconductor layer 14 in the following steps. The first isolation layer 19 in multiple trenches 15 and flat planes 16 is not covered by the crossover metal layer 21 in order to electrically isolate the first conductive layer 26 from the second conductive semiconductor layer 14 in the following steps as illustrated in the FIGS. 2E and 2E'. A part of the crossover metal layer 21 in the first area (I) extends to multiple trenches 15 and electrically connects to the first conductive semiconductor layer 12. The crossover metal layer 21 on multiple flat planes 16 and the pathways 18 in the first area (I) is electrically isolated from the second conductive semiconductor layer 14 by the first isolation layer 19. The crossover metal layer 21 on the conductive region 20 in the second area (II) electrically connects with the second conductive semiconductor layer 14 by the conductive connecting layer 17. A part of the crossover metal layer 21 in the second area (II) extends into the multiple trenches 15 and electrically connects to the first conductive semiconductor layer 12. The crossover metal layer 21 on multiple flat planes 16 and the pathways 18 in the second area (II) is electrically isolated from the second conductive semiconductor layer 14 by the first isolation layer 19. The crossover metal layer 21 on the conductive region 20 in the third area (III) electrically connects with the second conductive semiconductor layer 14 by the conductive connecting layer 17. Besides, the region b in the second area (II) and the third area (III)

adjacent to the conductive region 20 is not fully covered by the crossover metal layer 21 which is used for electrical isolation.

6. Forming a second isolation layer 22 on the crossover metal layer 21, the part of the first isolation layer 19 in the first area (I), and on the region b which is not fully covered by the crossover metal layer 21 in the second area (II). The second isolation layer 22 does not cover the inner side of the trenches 15 in the third area (III), the first isolation layer 19 of the multiple flat planes 16, and the region b which is not fully covered by the crossover metal layer 21 in the third area (III) as illustrated in the FIGS. 2F and 2F'.

7. Forming the first conductive layer 26 on the second isolation layer 22, in the multiple trenches 15 in the third area (III), on the first isolation layer 19 of the flat planes 16, and the region b which is not fully covered by the crossover metal layer 21 in the third area (III) as illustrated in the FIGS. 2G and 2G'.

8. Forming a bonding layer 24 on the first conductive layer 26 which is bonded with a permanent substrate 25 by the bonding layer 24 as illustrated in the FIG. 2H.

Figure 2I:
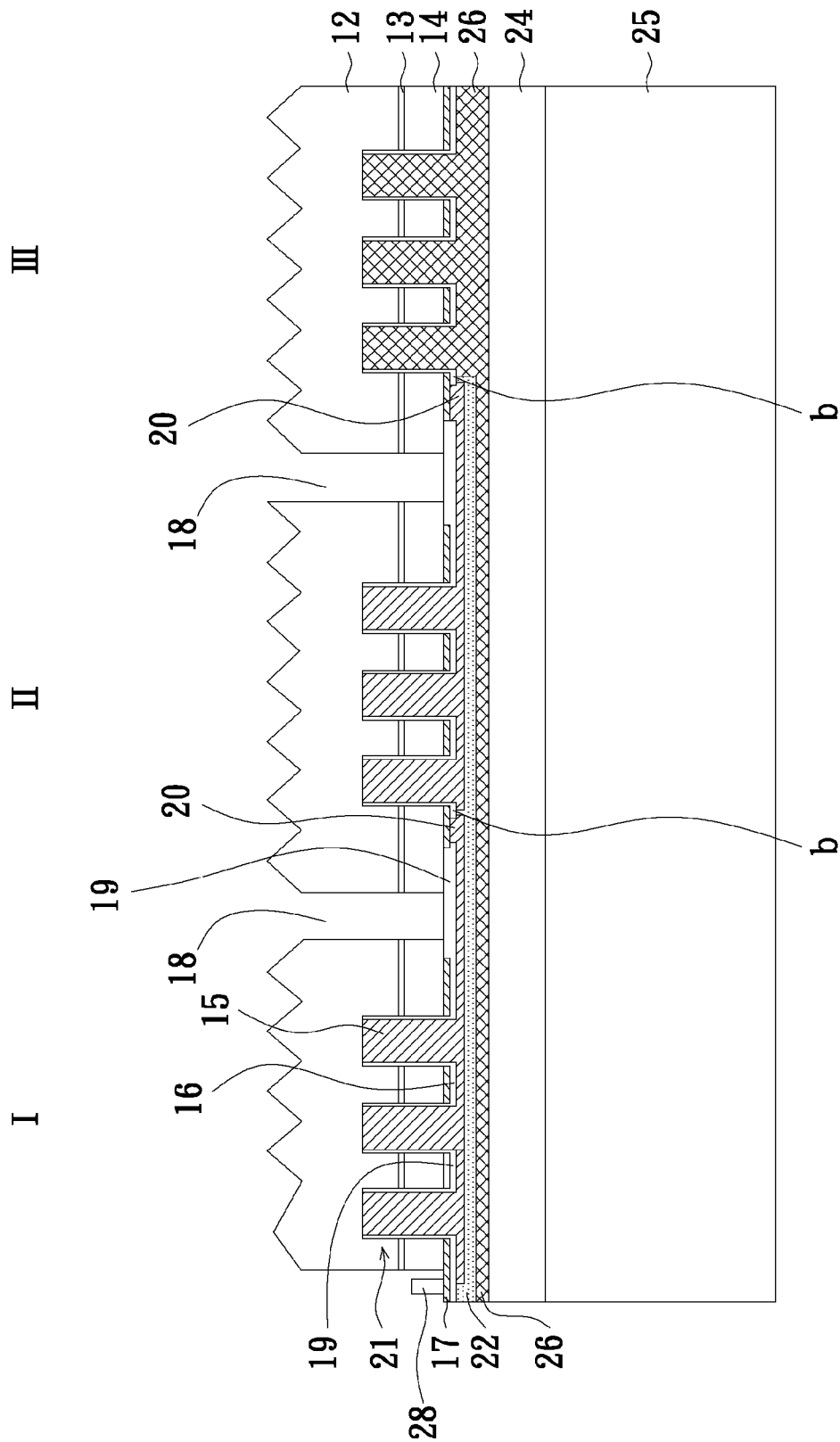

9. Removing the temporary substrate 11 to expose the first conductive semiconductor layer 12 and roughs the surface of the first conductive semiconductor layer 12. Next, etching multiple pathways 18 form the first conductive semiconductor layer 12 until the first isolation layer 19 is revealed in order to form N light-emitting diode units. Among the N light-emitting diode units, the first light-emitting diode unit locates in the first area (I), the second to the $(N-1)^{th}$ light-emitting diode units locate in the second area (II), and the $N^{th}$ light-emitting diode unit locates in the third area (III). Next, etching the first conductive semiconductor layer 12 in the first area (I) without the crossover metal layer 21 until the conductive connecting layer 17 is revealed, and forming a second electrode layer 28 on the conductive connecting layer 17. Thus an LED array 2 having N light-emitting diode units electrically connected in series by the crossover metal layer 21 is formed as illustrated in FIG. 2I.

The temporary substrate 11 described in the above first and second embodiments is made of, for example, gallium arsenide (GaAs), gallium phosphide (GaP), sapphire, silicon carbide (SiC), gallium nitride (GaN), or aluminum nitride. The epitaxial structure is made of an III-V group semiconductor material which is the series of aluminum gallium indium phosphide (AlGaInP) or the series of aluminum gallium indium nitride (AlGaInN). The conductive connecting layer 17 comprises indium tin oxide, cadmium tin oxide, antimony tin oxide, indium zinc oxide, aluminum zinc oxide, and zinc tin oxide. The first isolation layer 19 and the second isolation layer 22 can be made of an insulating material comprises silicon dioxide, titanium monoxide, titanium dioxide, trititanium pentoxide, titanium sesquioxide, cerium dioxide, zinc sulfide, and alumina. The first conductive layer 26 and the second conductive layer 23 can be made of silver or aluminum. The bonding layer 24 is an electrically conductive material made of metal or its alloys such as AuSn, PbSn, AuGe, AuBe, AuSi, Sn, In, Au, or PdIn. The permanent substrate 25 is a conductive material such as carbides, metals, metal alloys, metal oxides, metal composites, etc. The crossover metal layer 21 comprises metal, metal alloys, and metal oxides.

Although the present application has been explained above, it is not the limitation of the range, the sequence in practice, the material in practice, or the method in practice. Any modification or decoration for present application is not detached from the spirit and the range of such.

What is claimed is:

1. A light-emitting structure comprising:
   a first epitaxial unit;
   a second epitaxial unit disposed next to the first epitaxial unit;
   a crossover metal layer comprising a first protruding portion laterally overlapping the first epitaxial unit and the second epitaxial unit wherein the first protruding portion is electrically connected with the first epitaxial unit and the second epitaxial unit;
   a conductive connecting layer disposed below the first epitaxial unit and the second epitaxial unit and surrounding the first protruding portion; and
   an electrode arranged on the conductive connecting layer.

2. The light-emitting structure of claim 1, wherein the electrode is electrically connected with the conductive connecting layer and laterally overlaps the first epitaxial unit and the second epitaxial unit in a cross-sectional view.

3. The light-emitting structure of claim 2, wherein the electrode, the first epitaxial unit, and the second epitaxial unit are disposed in a row in a cross-sectional view.

4. The light-emitting structure of claim 1, wherein the first protruding portion is devoid of passing through the first epitaxial unit.

5. The light-emitting structure of claim 1, wherein the conductive connecting layer has a portion not covered by the first epitaxial unit.

6. The light-emitting structure of claim 1, further comprising a conductive layer disposed below the crossover metal layer wherein the cross metal layer comprises a second protruding portion entering the second epitaxial unit.

7. The light-emitting structure of claim 6, further comprising an isolation layer formed between the crossover metal layer and the conductive layer.

8. The light-emitting structure of claim 6, wherein the first protruding portion has an elevation substantially equal to that of the second protruding portion.

9. The light-emitting structure of claim 6, wherein the conductive layer comprises a portion arranged under the crossover metal layer.

10. The light-emitting structure of claim 6, wherein a width of the conductive layer is substantially equal to that of the light-emitting structure.

11. The light-emitting structure of claim 1, further comprising a first isolation layer arranged between the conductive connecting layer and the first protruding portion.

12. The light-emitting structure of claim 1, further comprising a roughened surface on top surfaces of the first epitaxial unit and the second epitaxial unit.

13. The light-emitting structure of claim 1, further comprising a permanent substrate under the first light emitting unit, and a bonding layer disposed between the permanent substrate and the first epitaxial unit.

14. The light-emitting structure of claim 13, wherein the first protruding portion is electrically connected with the bonding layer.

15. The light-emitting structure of claim 1, wherein the first epitaxial unit or the second epitaxial unit comprises an epitaxial structure, and the epitaxial structure comprises a first conductive semiconductor layer, an active layer, and a second conductive semiconductor layer.

16. The light-emitting structure of claim 15, wherein the first conductive semiconductor layer contacts the first protruding portion.

17. The light-emitting structure of claim 16, wherein the conductive connecting layer is electrically connected with the electrode.

18. The light-emitting structure of claim 1, wherein in a top view, the conductive connecting layer comprises a plurality of openings, and the first protruding portion is disposed in one of the plurality of openings.

19. The light-emitting structure of claim 18, wherein the plurality of openings is arranged in a matrix.

20. A light-emitting structure comprising:
   a light-emitting unit;
   a crossover metal layer comprising a protruding portion laterally overlapping the light-emitting unit, wherein the protruding portion is electrically connected with the light-emitting unit;
   a conductive connecting layer disposed below the light-emitting unit and surrounding the protruding portion; and
   an electrode arranged on the conductive connecting layer;
   wherein a top surface of the protruding portion contacts a surface of the light-emitting unit or the protruding portion is devoid of passing through the light-emitting unit.

\* \* \* \* \*